US007122882B2

(12) United States Patent
Lui et al.

(10) Patent No.: US 7,122,882 B2
(45) Date of Patent: Oct. 17, 2006

(54) LOW COST POWER MOSFET WITH CURRENT MONITORING

(75) Inventors: Sik K. Lui, Sunnyvale, CA (US); Anup Bhalla, Santa Clara, CA (US)

(73) Assignee: Alpha and Omega Semiconductor Ltd., Hamilton (BM)

( * ) Notice: Subject to any disclaimer, the term of this patent is extended or adjusted under 35 U.S.C. 154(b) by 0 days.

(21) Appl. No.: 10/979,410

(22) Filed: Nov. 2, 2004

(65) Prior Publication Data

US 2006/0091505 A1 May 4, 2006

(51) Int. Cl.
*H01L 23/495* (2006.01)

(52) U.S. Cl. ...................... 257/666; 257/723; 257/778; 257/48; 257/E25.013

(58) Field of Classification Search ................. 257/666
See application file for complete history.

(56) References Cited

U.S. PATENT DOCUMENTS 5,422,593 A * 6/1995 Fujihira ...................... 327/561
6,392,859 B1 * 5/2002 Ohshima .................... 361/100
6,933,593 B1 * 8/2005 Fissore et al. .............. 257/675

* cited by examiner

*Primary Examiner*—Tu-Tu Ho
(74) *Attorney, Agent, or Firm*—Schein & Cai LLP; Douglas Mackenzie; James Cai

(57) ABSTRACT

A semiconductor integrated circuit package having a common source current sensing circuit includes a main die having an integrated circuit, the main die including a source bonding pad and a gate bonding pad disposed on an upper surface, a leadframe having a leadframe pad disposed under the main die, and a monitoring die including a source bonding pad and a gate bonding pad disposed on an upper surface, the monitoring die being coupled to the main die in such manner that the main die source bonding pad is coupled to the monitoring die source bonding pad and the main die gate bonding pad is coupled to the monitoring die gate bonding pad and such that the main die and monitoring die upper surfaces are adjacent to one another.

11 Claims, 5 Drawing Sheets

LOW COST POWER MOSFET WITH CURRENT MONITORING

BACKGROUND OF THE INVENTION

The present invention generally relates to current sensing circuits, and more particularly to a common source current sensing circuit integrated with a trench power MOSFET.

In many power MOSFET applications, monitoring a large current flowing in a load is accomplished by a current sensing element. The current sensing element may include a transistor having a much smaller number of cells than the number of cells in the power MOSFET whose load current is being sensed. The ratio of the number of cells in the current sensing element to the number of cells in the power MOSFET may be on the order of 1:1 million cells.

A conventional current sensing circuit is disclosed in U.S. Pat. No. 4,553,084 entitled "Current Sensing Circuit" to Wrathall. With reference to FIG. 1, the disclosed circuit includes an MOS transistor 11 having its source coupled to supply voltage 12, which for example, may be ground. MOS transistor 13 has its source coupled to supply voltage terminal 12 by sense resistor 14. The drains of both transistors 11, 13 are coupled to supply voltage terminal 15 by load 16. Input node 10 receives a load current from load 16. Gate drive 17 provides a voltage Vg to the gates of transistors 11, 13.

Amplifier 18 has a first input terminal 19 connected to the source of transistor 13 and a second input terminal 21 connected to a reference voltage terminal 22. The output of amplifier 18 is connected to output terminal 23. The output signal from output terminal 23 provides an indication of the load current through load 16 exceeding a predetermined limit. The output signal from output terminal 23 may be provided as feedback to gate drive 17 for performing a current limiting or constant current function. Current flow through transistors 11, 13 is in proportion to the number of cells in each of transistors 11, 13.

The Wrathall scheme is a common drain scheme and is inherently inaccurate. In order for the amplifier 18 to sense reliably, the voltage developed across the sense resistor 14 is typically on the order 0.5V. This voltage across the sense resistor 14 reduces the Vgs of sensing transistor 13 by about the same amount. Hence transistors 11, 13 are operating under different Vgs conditions. With reference to FIG. 2, a difference in current flow through each single cell of two identical transistors having different applied Vgs is shown. As shown, the difference in current flow increases with increasing Vds. When using a transistor with a smaller number of cells as the sensing transistor 13 to sense the current through a transistor 11 having a larger number of cells, the sensed current will deviate from the actual current as shown in FIG. 3.

A more accurate approach employs a common-source configuration as shown in FIG. 4. A common source sensing circuit includes a MOS transistor 40 having its source coupled to supply voltage 42, which for example, may be ground. MOS transistor 43 also has its source coupled to supply voltage terminal 42. The drain of transistor 43 is coupled to supply voltage terminal 45 by sensing resistor 46. Gate drive 30 provides a voltage Vg to the gates of transistors 40, 43. In this configuration, the voltage developed across the sense resistor 46 will not affect the Vgs of the sense transistor 43.

Amplifier 48 has a first input terminal 47 connected to the drain of transistor 43 and a second input terminal 41 connected to a reference voltage terminal 44. The output of amplifier 48 is connected to output terminal 49. The output signal from output terminal 49 provides an indication of the sensed current through resistor 46 exceeding a predetermined limit. The output signal from output terminal 49 may be provided as feedback to gate drive 30 for performing a current limiting or constant current function. Current flow through transistors 40, 43 is in proportion to the number of cells in each of transistors 40, 43.

In the common source configuration transistors 40, 43 operate on the same Vgs curve. Thus the problem shown in FIG. 2 with reference to the common drain scheme disclosed by Wrathall is eliminated.

In standard CMOS design, the common source sensing circuit can be integrated easily into the same power IC chip. For higher performance trench power MOSFET designs, the drains of every cell are connected together making it more difficult to achieve such integration.

The present invention provides for a unique device and packaging design which integrates the common source sensing circuit into a trench power MOSFET device.

SUMMARY OF THE INVENTION

In accordance with one aspect of the invention, a semiconductor device having a common source current sensing circuit includes a main die having source and gate terminals, and a monitoring die having source and gate terminals, the monitoring die coupled to the main die such that main die source and gate terminals are coupled to monitoring die source and gate terminals.

In accordance with another aspect of the invention, a semiconductor integrated circuit package having a common source current sensing circuit includes a main die having an integrated circuit, the main die including a source bonding pad and a gate bonding pad disposed on an upper surface, a leadframe having a leadframe pad disposed under the main die, and a monitoring die including a source bonding pad and a gate bonding pad disposed on an upper surface, the monitoring die being coupled to the main die in such manner that the main die source bonding pad is coupled to the monitoring die source bonding pad and the main die gate bonding pad is coupled to the monitoring die gate bonding pad and such that the main die and monitoring die upper surfaces are adjacent to one another.

In accordance with yet another aspect of the invention, a semiconductor integrated circuit package having a common source current sensing circuit includes a main die having an integrated circuit, the main die including a source bonding pad and a gate bonding pad disposed on an upper surface, a leadframe having a leadframe pad disposed under the main die, and a monitoring die including a source bonding pad and a gate bonding pad disposed on an upper surface, the monitoring die being coupled to the main die in such manner that the main die source bonding pad is coupled to the monitoring die source bonding pad and the main die gate bonding pad is coupled to the monitoring die gate bonding pad and such that the main die upper surface is disposed below and adjacent to the monitoring die upper surface.

These and other features, aspects and advantages of the present invention will become better understood with reference to the following drawings, description and claims.

DETAILED DESCRIPTION OF THE INVENTION

The following detailed description is of the best modes of carrying out the invention. The description is not to be taken in a limiting sense, but is made merely for the purpose of illustrating the general principles of the invention, since the scope of the invention is best defined by the appended claims.

The present invention generally provides a unique device and packaging design which integrates a common source sensing circuit into a trench power MOSFET.

Figure 1:
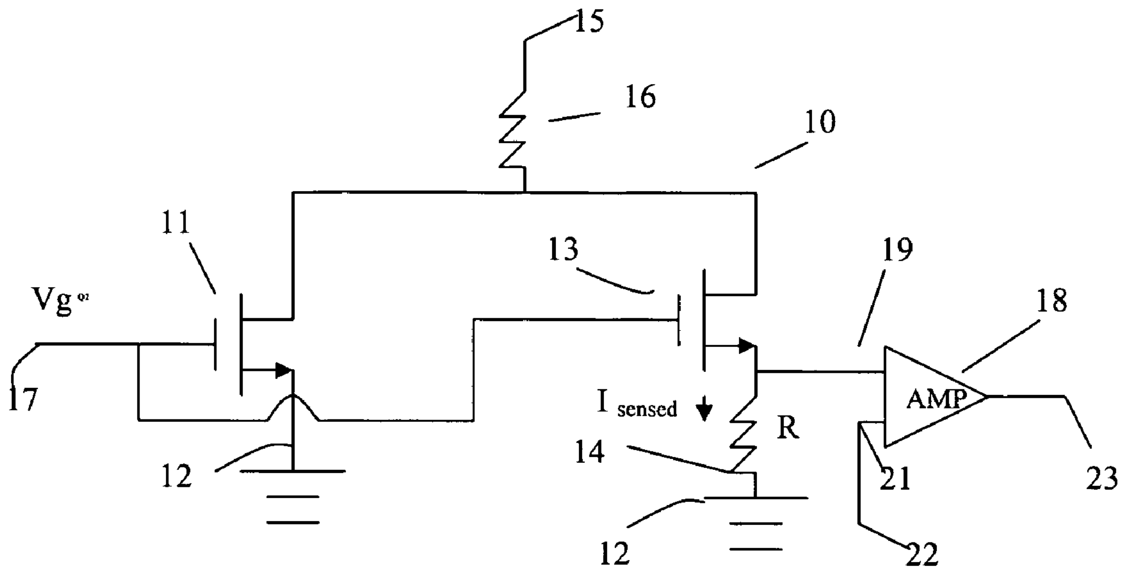
FIG. 1 is schematic representation of a common drain sensing circuit.
Figure 2:
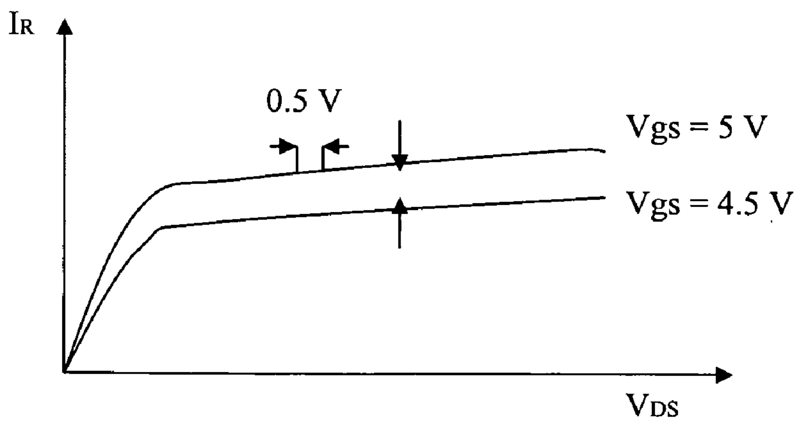
FIG. 2 is a graph showing a variance in values of current $I_R$ for values of Vds.
Figure 3:
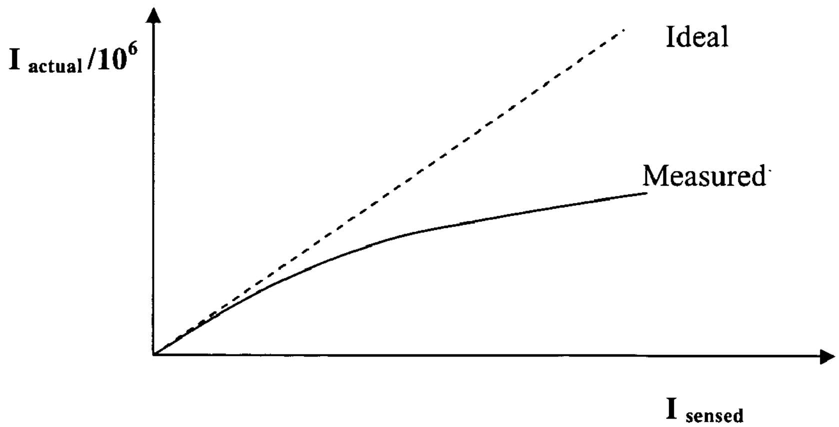
FIG. 3 is a graph showing a variance between $I_{ACTUAL}$ and $I_{SENSED}$.
Figure 4:
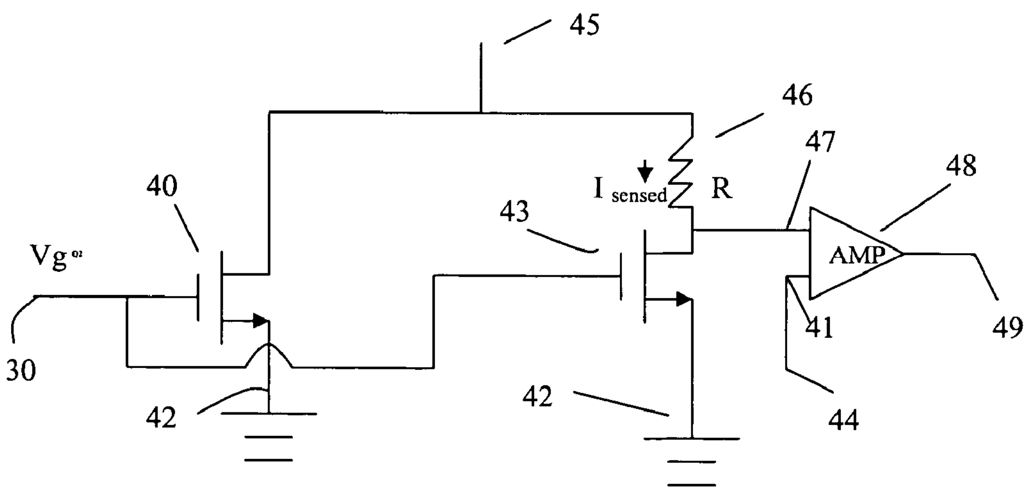
FIG. 4 is a schematic representation of a common source sensing circuit.
Figure 5A:
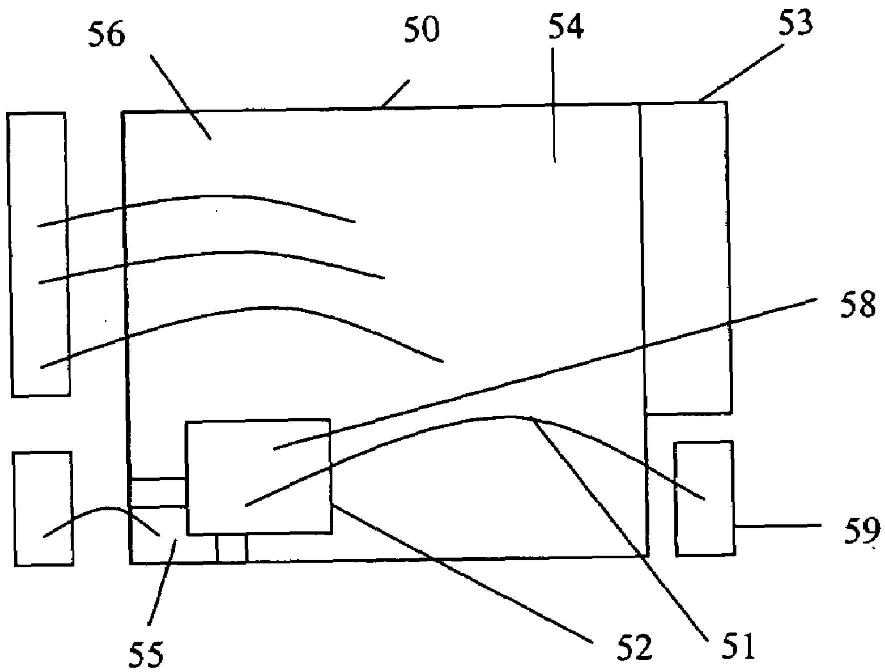
FIG. 5A is a top plan view of power MOSFET package in accordance with the present invention.

In a first aspect of the invention and with reference to FIG. 5A, a monitoring die 52 may be attached to a main power MOSFET die 50 using chip-on-chip technology. The main power MOSFET die 50 may be coupled to a leadframe 53 using conventional methods. such that leadframe 53 comprises a main die drain lead. A top surface 54 of main power MOSFET die 50 may include a passivation layer with contact openings for both gate 55 and source 56 wire bonding as well as for monitoring die 52 bonding. Monitoring die 52 may also have a passivation layer with contact openings for contact to the main power MOSFET die 50.

Figure 5B:
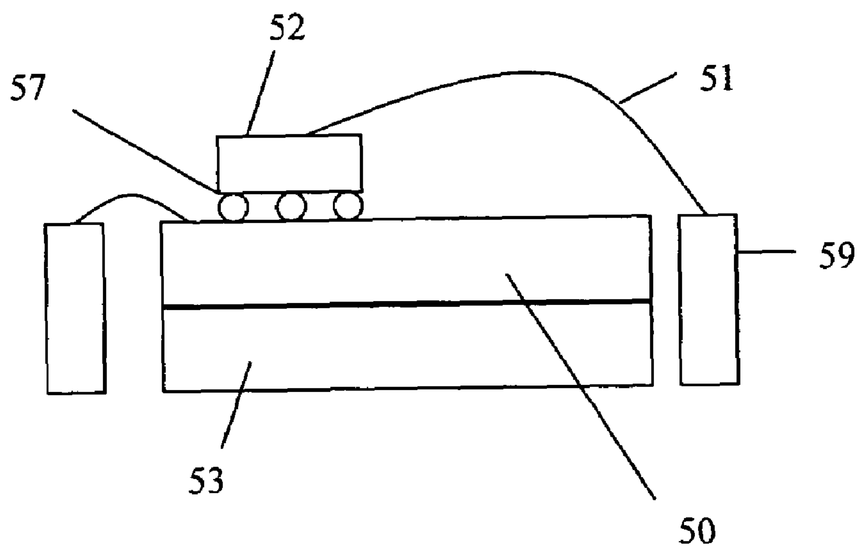
FIG. 5B is a cross sectional view of the power MOSFET package of FIG. 5A in accordance with the present invention.

Solder bumps 57 (FIG. 5B) on main power MOSFET die 50 may match a footprint of the monitoring die 52 source and gate contact openings as further described herein. The monitoring die 52 may be flipped and attached to the source 56 and gate 55 of the main power MOSFET die 50 by means of solder bumps 57 or using conducting epoxy. Monitoring die drain 58 (FIG. 5A) may be wire bonded to leadframe monitoring die drain lead 59 by wire 51. Other connecting methods such as metal clip may also be used.

Figure 6:
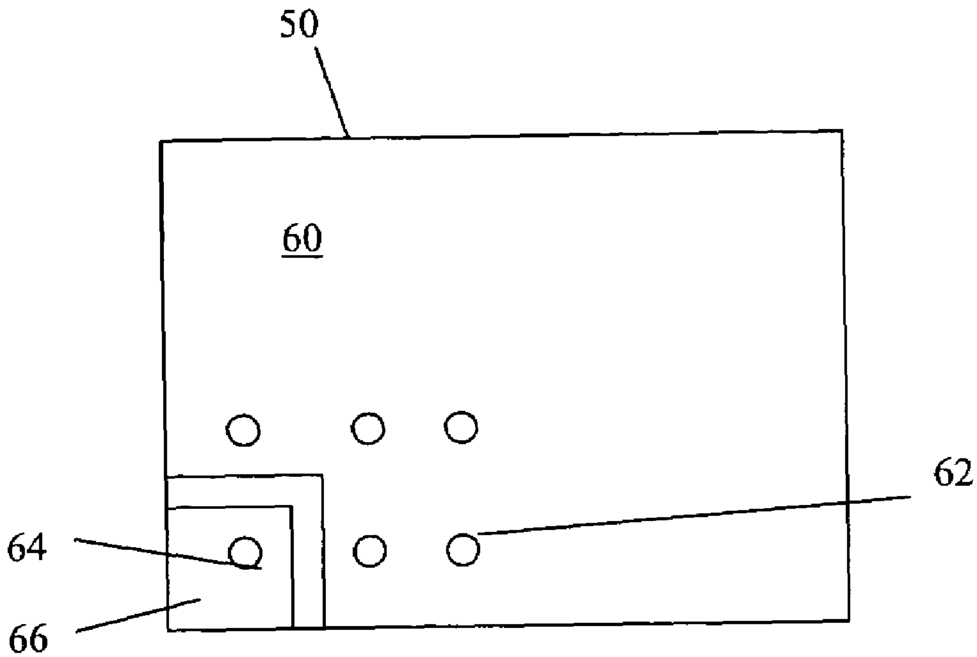
FIG. 6 is a top plan view of a contact pad on a main die surface in accordance with the present invention.
Figure 7:
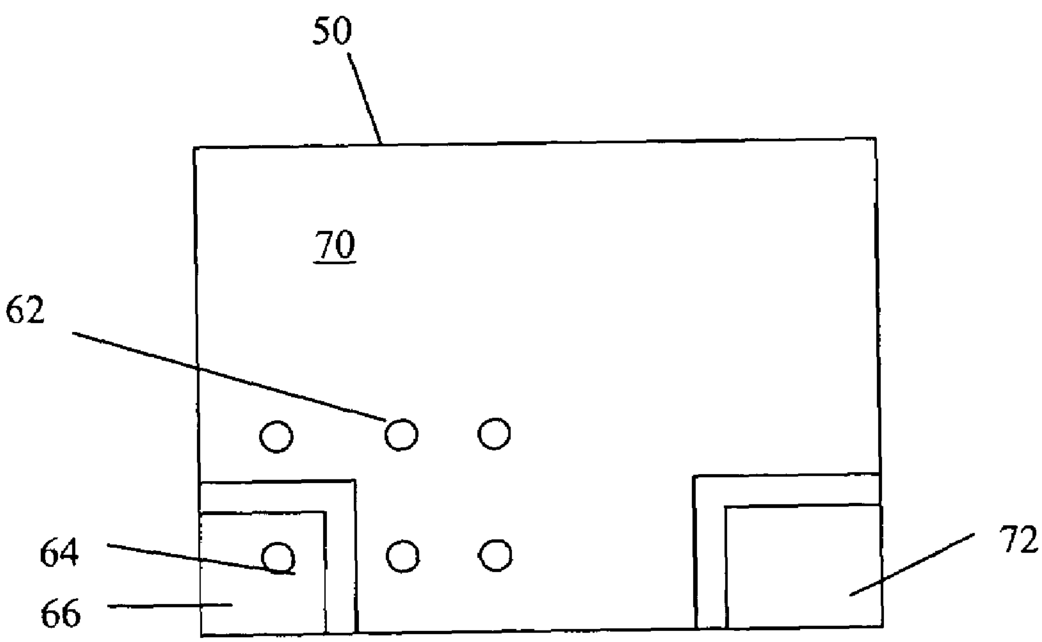
FIG. 7 is a top view of an alternative embodiment of a contact pad on a main die surface in accordance with the present invention.

With reference to FIG. 6, main power MOSFET die 50 may include a contact pad 60 having source solder bumps 62 and gate solder bump 64 formed on gate pad 66. Gate pad 66 provides for connection between monitoring die 52 and main power MOSFET die 50 by means of solder bump 64 and for wire bonding to leadframe 53. In another aspect of the invention and with reference to FIG. 7, main power MOSFET die 50 may include a contact pad 70 having an additional gate pad 72 for wire bonding to leadframe 53.

Figure 8:
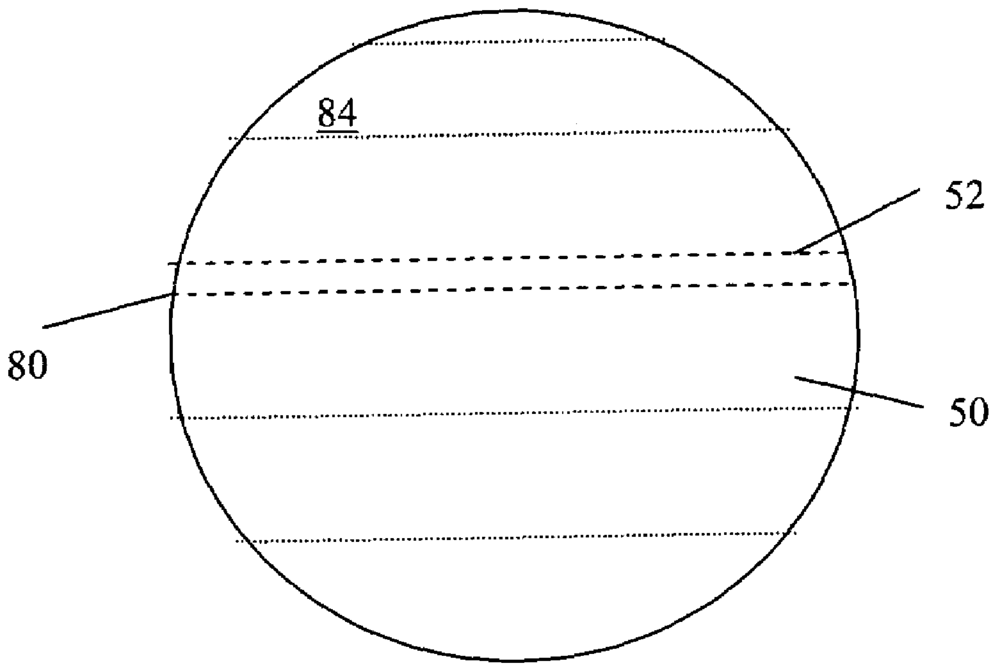
FIG. 8 is a top plan view of a layout having monitoring dies concentrated in one strip on a wafer in accordance with the present invention.
Figure 9:
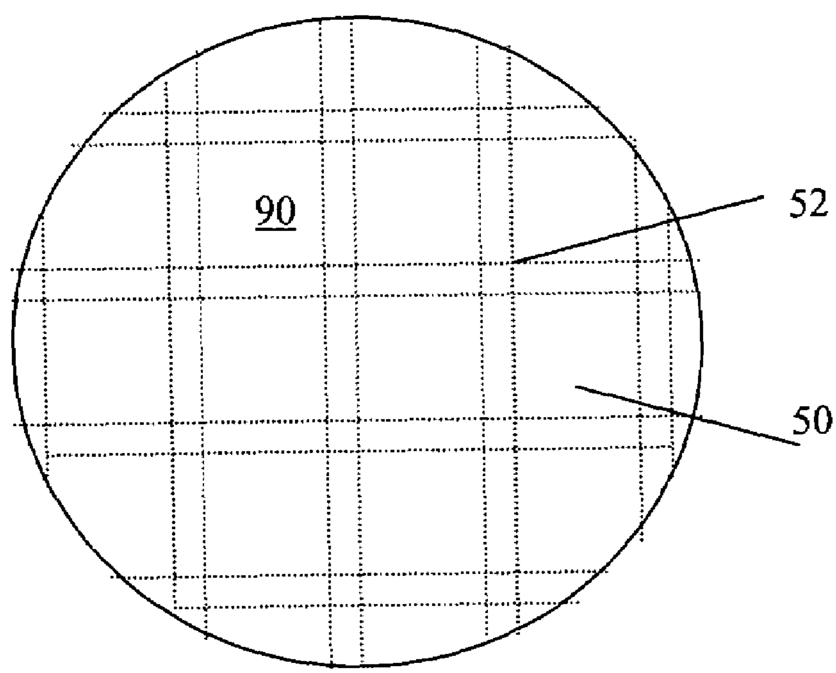
FIG. 9 is a top plan view of a layout having monitoring dies distributed evenly throughout a wafer in accordance with the present invention.

To ensure that monitoring die 52 has the same characteristics as the main power MOSFET die 50, it is desirable to form the monitoring die 52 and the main power MOSFET die 50 on the same wafer. FIG. 8 shows a layout in which a plurality of monitoring dies 52 are concentrated in a strip 80 on a wafer 84. As shown it is desirable to form the monitoring dies 52 closely beside the main power MOSFET dies 50. In another aspect of the invention and with reference to FIG. 9, a wafer 90 may include a plurality of monitoring dies 52 distributed evenly throughout the wafer 90.

It should be understood, of course, that the foregoing relates to preferred embodiments of the invention and that modifications may be made without departing from the spirit and scope of the invention as set forth in the following claims.

We claim:

1. A semiconductor device having a common source current sensing circuit comprising:

a main die having source and gate terminals;

a monitoring die having source and gate terminals, the monitoring die coupled to the main die such that main die source and gate terminals are coupled to the monitoring die source and gate terminals; and wherein the monitoring die comprises an upper surface having the source and gate terminals and the main die comprises an upper surface having the source and gate terminals and the monitoring die upper surface and the main die upper surface are disposed one on top of the other.

2. The semiconductor device according to claim 1, wherein the monitoring die is soldered to the main die.

3. The semiconductor device according to claim 1, wherein the main die comprises an integrated circuit and the monitoring die comprises the sensing circuit.

4. The semiconductor package according to claim 3, wherein the integrated circuit comprises a MOSFET device.

5. The semiconductor device according to claim 1, wherein the main die and the monitoring die have separate drain leads.

6. The semiconductor device according to claim 1, wherein the main die comprises a gate pad for providing contact between the main die gate terminal and the monitoring die gate terminal.

7. The semiconductor device according to claim 1, wherein the main die and the monitoring die are fabricated on the same wafer.

8. A semiconductor integrated circuit package having a common source current sensing circuit comprising:

a main die having an integrated circuit, the main die including a source bonding pad and a gate bonding pad disposed on an upper surface;

a leadframe having a leadframe pad disposed under the main die; and a monitoring die including a source bonding pad and a gate bonding pad disposed on an upper surface, the monitoring die being coupled to the main die in such manner that the main die source bonding pad is coupled to the monitoring die source bonding pad and the main die gate bonding pad is coupled to the monitoring die gate bonding pad and such that the main die upper surface is disposed below and adjacent to the monitoring die upper surface.

9. The semiconductor integrated circuit package according to claim 8, wherein the monitoring die is soldered to the main die.

10. The semiconductor integrated circuit package according to claim 8, wherein the monitoring die is metal clipped to main die.

11. The semiconductor integrated circuit package according to claim 8, wherein the main die and the monitoring die are fabricated on the same wafer.

* * * * *